(12) United States Patent
Schwarzenbach et al.

(10) Patent No.: US 7,749,862 B2
(45) Date of Patent: Jul. 6, 2010

(54) METHODS FOR MINIMIZING DEFECTS WHEN TRANSFERRING A SEMICONDUCTOR USEFUL LAYER

(75) Inventors: Walter Schwarzenbach, Saint Nazaire les Eymes (FR); Nadia Ben Mohamed, Renage (FR); Christophe Maleville, La Terrasse (FR); Corinne Maunand Tussot, Meylan (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 111 days.

(21) Appl. No.: 11/624,867

(22) Filed: Jan. 19, 2007

(65) Prior Publication Data

US 2007/0117229 A1 May 24, 2007

Related U.S. Application Data

(63) Continuation of application No. 11/020,057, filed on Dec. 21, 2004, now abandoned, and a continuation-in-part of application No. 11/001,088, filed on Dec. 2, 2004, now Pat. No. 7,300,856, which is a continuation of application No. 10/426,717, filed on May 1, 2003, now Pat. No. 6,828,216.

(30) Foreign Application Priority Data

May 2, 2002 (FR) .................................. 02 05500
Aug. 19, 2004 (FR) .................................. 04 08980

(51) Int. Cl.
*H01L 21/30* (2006.01)
(52) U.S. Cl. ................. 438/458; 438/455; 257/E21.122
(58) Field of Classification Search ......... 438/455–459; 257/E21.122
See application file for complete search history.

(56) References Cited

U.S. PATENT DOCUMENTS 5,374,564 A 12/1994 Bruel .......................... 438/455

(Continued)

FOREIGN PATENT DOCUMENTS

EP 0 954 014 A1 11/1999

(Continued)

OTHER PUBLICATIONS

Stengl et al., A Model for the Silicon Wafer Bonding Process, Japanese Journal of Apllied Physics, vol. 28, No. 10, Oct. 1989 p. 1735-1741.*

(Continued)

*Primary Examiner*—Richard A. Booth
(74) *Attorney, Agent, or Firm*—Winston & Strawn LLP

(57) ABSTRACT

A method for minimizing defects when transferring a useful layer from a donor wafer to a receptor wafer is described. The method includes providing a donor wafer having a surface below which a zone of weakness is present to define a useful layer to be transferred, molecularly bonding at a bonding interface the surface of the useful layer of the donor wafer to a surface of the receptor wafer to form a structure, heating the structure at a first temperature that is substantially higher than ambient temperature for a first time period sufficient to liberate water molecules from the bonding interface, with the heating being insufficient to cause detachment of the useful layer at the zone of weakness, and detaching the useful layer from the donor wafer.

17 Claims, 2 Drawing Sheets

U.S. PATENT DOCUMENTS

| | | | |
|---|---|---|---|
| 6,150,239 A | 11/2000 | Goesele et al. | 438/458 |
| 6,211,041 B1 | 4/2001 | Ogura | 438/458 |
| 6,287,941 B1 | 9/2001 | Kang et al. | 438/459 |
| 6,303,468 B1 | 10/2001 | Aspar et al. | 438/455 |
| 6,368,038 B1 | 4/2002 | Uno | 411/161 |
| 6,368,938 B1 | 4/2002 | Usenko | 438/407 |
| 6,455,398 B1 * | 9/2002 | Fonstad et al. | 438/459 |
| 6,461,939 B1 | 10/2002 | Furihata et al. | 438/459 |
| 6,506,665 B1 | 1/2003 | Sato | 438/458 |
| 6,540,827 B1 | 4/2003 | Levy et al. | 117/3 |
| 6,828,616 B2 | 12/2004 | Oh et al. | 257/303 |
| 7,202,139 B2 * | 4/2007 | Yeo et al. | 438/455 |
| 2002/0047169 A1 | 4/2002 | Kunikiyo | 257/410 |
| 2003/0008477 A1 | 1/2003 | Kang et al. | 438/458 |
| 2003/0216008 A1 | 11/2003 | Schwarzenbach et al. | 438/458 |
| 2004/0110320 A1 | 6/2004 | Aspar et al. | 438/110 |
| 2004/0115900 A1 | 6/2004 | Huang et al. | 438/458 |
| 2004/0161904 A1 | 8/2004 | Berne et al. | 438/455 |

FOREIGN PATENT DOCUMENTS

| | | |
|---|---|---|
| EP | 1 359 615 A1 | 11/2003 |
| EP | 1 429 381 A2 | 6/2004 |

OTHER PUBLICATIONS

W.P. Maszara, "Silicon-On-Insulator by Wafer Bonding: A Review," J. Electrochem. Soc., vol. 138, No. 1, pp. 341-347 (1991).

* cited by examiner

METHODS FOR MINIMIZING DEFECTS WHEN TRANSFERRING A SEMICONDUCTOR USEFUL LAYER

CROSS-REFERENCE TO RELATED APPLICATIONS

This application is a continuation of application Ser. No. 11/020,057 filed Dec. 21, 2004 now abandoned. This application is also a continuation-in-part of application Ser. No. 11/001,088 filed Dec. 2, 2004 now U.S. Pat. No. 7,300,856, which is a continuation of application Ser. No. 10/426,717 filed May 1, 2003, now U.S. Pat. No. 6,828,216. The entire content of each application is expressly incorporated herein by reference thereto.

BACKGROUND

1. Field of the Invention

The present invention relates to methods for minimizing defects when transferring a useful layer of semiconductor material from a first wafer to a second wafer to produce a final structure. The final structure may be a semiconductor-on-insulator (SOI) structure that is useful for microelectronics, optics or optoelectronics applications.

2. Background Art

A typical layer transfer process includes forming a zone of weakness in a first wafer at a depth that is close to or greater than the thickness of a transfer layer. The zone of weakness is created by implanting atomic species, or by forming a porous layer, or by using any other method to weaken the mechanical bonds at a predetermined depth in the first wafer. The layer transfer process also includes bringing the surfaces of the two wafers into contact so that a surface of the transfer layer is in contact with the second wafer, and then supplying energy to detach the transfer layer from the first wafer at the zone of weakness. An additional heat treatment, known as a "stabilizing anneal", can then be conducted to improve bonding between the second wafer and the transferred layer.

A problem associated with such a layer transfer process is that organic or inorganic contaminants or gas pockets may become trapped at the interface of the two wafers during bonding, which can detrimentally affect the efficiency and quality of the bond and thus the quality of the desired final structure. This problem is of particular concern when one or more additional treatments is/are carried out close to the bonding interface in order to modify the mechanical, physical, or chemical properties of the two wafers. In particular, such problems may occur when atomic species implantation is conducted close to a wafer surface prior to bonding to form the zone of weakness (for example, when using a "SMART-CUT®" method). Under these circumstances, contaminants or gas pockets may cause superficial blisters on the implanted wafer, and/or may lead to zones or portions of the wafer which are not transferred when the transfer layer is detached. Such defects close to the surface of the wafer are usually not reduced in number during a stabilizing heat treatment.

When conducting a SMART-CUT® process, the defects can detrimentally affect the structural properties of the detached transfer layer. In addition, such defects could cause detachment to occur at the bonding interface or defect location instead of at the implanted zone, thus creating "non-transferred" zones resulting in structural defects in the detached layer.

When such defects are detected after contact, a conventional solution for removing at least some of the defects is to break the bond between the two wafers by applying suction to a back face, then to clean the wafers and bond them together again. For example, a wafer may be scrubbed clean by using a wafer cleaner known as a scrubber. Although this process is somewhat effective, it requires breaking the bond between two wafers and then using a mechanical or chemical action on the surfaces. These processes subject the wafers to the conventional risks associated with such manipulations.

SUMMARY OF THE INVENTION

Presented is an advantageous method for minimizing defects when transferring a useful layer from a donor wafer to a receptor wafer is described. The method includes providing a donor wafer having a surface below which a zone of weakness is present to define a useful layer to be transferred, molecularly bonding at a bonding interface the surface of the useful layer of the donor wafer to a surface of the receptor wafer to form a structure, heating the structure at a first temperature that is substantially higher than ambient temperature for a first time period sufficient to liberate water molecules from the bonding interface, with the heating being insufficient to cause detachment of the useful layer at the zone of weakness, and detaching the useful layer from the donor wafer.

In an advantageous embodiment, the first temperature is in the range of about 200° C. to about 400° C., and may be about 350° C. The first time period may be in the range of about 10 minutes to about 360 minutes. In a variant, the first time period is in the range from about 30 minutes to about 120 minutes. The method may further include annealing the structure at a second temperature that is substantially higher than the first temperature for a second time period to reinforce the bond at the interface prior to detaching. The first temperature may be no greater than about 400° C., and the second temperature may be no greater than about 500° C. In addition, the annealing may include increasing the temperature in a substantially progressive manner between the first and second temperatures. In particular, the temperature may increase continuously over time at a rate of no less than about 0.5° C./minute.

A beneficial embodiment further includes, prior to bonding the useful layer to the receptor wafer, forming the zone of weakness in the donor wafer by atomic species implantation. Another beneficial embodiment further includes, prior to bonding the useful layer to the receptor wafer, forming the zone of weakness in the donor wafer by providing a porous layer in the donor wafer. In yet another variant, the technique further includes, prior to bonding the useful layer to the receptor wafer, forming a layer of bonding material on at least one of the surfaces of the useful layer or the receptor wafer. The bonding material may be at least one of an electrical insulator or $SiO_2$.

In a preferred embodiment, the method also includes, prior to bonding the useful layer to the receptor wafer, forming a layer of bonding material on each of the useful layer surface and the receptor wafer surface. The bonding material may be at least one of an electrical insulator or $SiO_2$. In a variant, the method includes, prior to bonding the useful layer to the receptor wafer, cleaning at least one of the useful layer surface of the donor wafer or the receptor wafer surface. In this case, cleaning may include at least one of chemical treatment, rinsing, or scrubbing.

In another advantageous embodiment, the method further includes recycling a remainder portion of the donor wafer after detaching the useful layer. Advantageously, the transferring of the useful layer from the donor wafer to the receptor wafer forms an SOI structure.

BRIEF DESCRIPTION OF THE FIGURES

Other aspects, purposes and advantages of the invention will become clear after reading the following detailed description with reference to the attached drawings, in which.

DETAILED DESCRIPTION OF THE PREFERRED EMBODIMENTS

Figure 1:
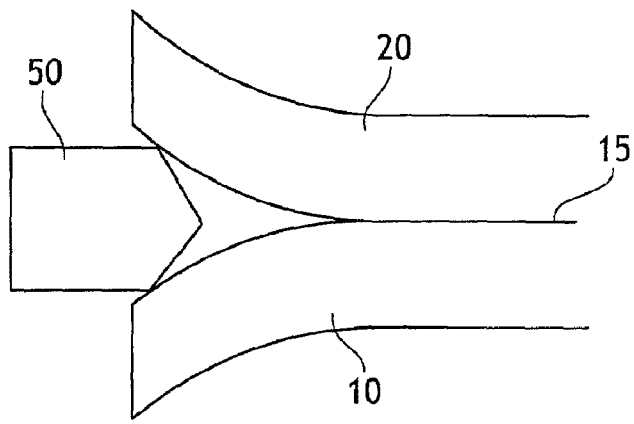
FIG. 1 shows a technique for measuring the bonding energy of two wafers.

Generally, the present method seeks provide an improved method for transferring a useful layer from a first wafer to a second wafer, wherein the first wafer includes a zone of weakness that defines the useful layer. The useful layer is a semiconductor material. The technique includes bringing the surfaces of the two wafers into contact so that the surface of the useful layer is in contact with the second wafer, supplying heat energy at a first temperature that is substantially higher than ambient temperature for a first time period, and supplying additional heat energy to increase the temperature above the first temperature to detach the useful layer at the zone of weakness.

Preferred aspects of the bonding method may include any of the following features. Heat energy at a second temperature that is substantially higher than the first temperature may be applied for a second time period that follows the first application of heat, to reinforce the bonding linkages between the two wafers. The second temperature may be about 500° C. The additional heat energy may be supplied in a substantially progressive manner between the first and second temperatures. In particular, the heat energy may be supplied such that the temperature increases continuously over time with a ramp-up that is greater than about 0.5° C./minute. The first temperature may be in the range of about 200° C. to about 400° C., and in particular the first temperature is about 350° C. The first time period may be in the range of about 10 minutes (min) to about 360 min, or more particularly the first time period may be in the range from about 30 min to about 120 min.

Before the surfaces of the two wafers are brought into contact, a layer of bonding material may be formed on one of the two wafer bonding surfaces, and the bonding material may be an electrical insulator, or may be $SiO_2$. Before the surfaces of the two wafers are brought into contact, at least one of the two surfaces to be bonded undergoes a cleaning step, and the cleaning step may include at least one of the following cleaning techniques: chemical treatment, rinsing, or scrubbing. Before the surfaces of the two wafers are brought into contact, the method includes forming the zone of weakness in the first wafer, and the zone of weakness may be formed by atomic species implantation. In a second aspect, the invention provides an application of a layer transfer method to produce a SOI structure.

In an embodiment, the present method reduces the significance of defects and surface roughness of a useful layer that has been detached from a first wafer (termed the "donor wafer") at an existing zone of weakness, during the transfer of the useful layer from the donor wafer to a second wafer, called the "receptor wafer". After forming the zone of weakness in the donor wafer, for example, by atomic species implantation or by forming a porous layer, the donor wafer and the receptor wafer are then bonded together. The useful layer is then detached successively, simultaneously or in an overlapping manner, by using heat treatments. Advantageously, the surfaces of the wafers to be bonded are cleaned prior to bonding and prior to detachment. The cleaning methods employed may include scrubbing, chemical treatments such as RCA treatments, use of ozone-treated water or CARO, or successive rinses. Such surface finishing operations are utilized both to withdraw particles from the surface and to energetically activate the surface.

The phrase "energetic activation" of a surface of a wafer pertains to the activation of potential energies on the surface of the wafers (wherein the potential energies are principally a manifestation of hanging bonds from the surface atoms). The potential energies may be used as bonding energy with other particles which will come close to the surface. When two wafers with respective treated bonding surfaces are placed into contact, adhesion of the two wafers occurs. The bonding or adhesion is primarily due to molecular interaction between hydrogen atoms present on the bonding surfaces of the wafers. Molecular bonding is facilitated because of the hydrophilic nature of the bonding surfaces. In accordance with the present technique, heat treatments are then conducted.

At the interface between the wafers, the properties and physical and/or chemical connections of the surface atoms differ depending on the temperature and duration of the heating to which the wafers are subjected. At ambient temperature, water molecules present at the interface between the wafers are free to diffuse and will bond with hanging bonds from the surface silicon atoms in the form of OH radicals. The set of hydrogen bonds between the OH radicals thus constitute the molecular bonding between the wafers at their interface.

An increase in bond strength has been observed at temperatures higher than 1000° C. For example, one can refer to studies carried out by W. P. Maszara in the document entitled "Silicon-on-Insulator by Wafer Bonding" (Journal of the Electrochemical Society, vol. 138, p 341 (1991)). An increase in bond strength was derived from the formation of Si—O—Si bonds replacing hydrogen-bond molecular bonding at the wafer interface. Between these two limiting temperature values (ambient temperature and 1000° C.), and for a temperature of more than about 200° C., it has been observed that water is no longer really free to diffuse between the wafers. Water molecules are then formed following modifications to the atomic bonds as follows:

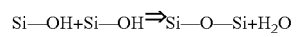

Instead of OH bonds which combine to form water molecules, Si—O—Si bonds are created which strongly bind the two wafers together, thus strengthening the adhesive connections. The higher the temperature, the stronger the wafers are bonded.

Water molecules formed in the above reaction collect into localized aggregates and will disappear after a certain temperature and time combination. For example, for a temperature of about 350° C., it is estimated that the water molecule liberation period is typically on the order of about 30 minutes to about one hour. An increase in temperature could evacuate water molecules more rapidly and avoid problems which may be caused by the presence of the aqueous aggregates. However, when the temperature increases, an increase in post-detachment roughness values (i.e. at the detachment surface) has been observed, which is primarily due to thermal phenomena occurring within the zone of weakness as the temperature increases. Further, an inhomogeneous roughness occurs. A higher degree of roughness is routinely present at the zone wherein wafer detachment is initiated (which is usually the hottest zone), and this zone is termed the "dense zone".

For a detached useful layer or thin layer that is a few 100 Å thick, the degree of roughness can be too high if it is greater than a few Angstroms (Å) rms (root mean square) of roughness. Such an estimation of the "maximum tolerated roughness" primarily depends on the desired final technical specifications. In all cases, it has been observed that an increase in temperature increases the roughness. Consequently, there may exist a threshold temperature beyond which the water aggregates will disappear from the interface of the two wafers, and a maximum temperature beyond which the degree of roughness at the detachment surface of the removed layer could potentially become too high. Using a heat treatment at a temperature located between these two limiting temperatures could thus improve the bonding quality of the two wafers before using a detachment heat treatment, which treatment will then be carried out at a higher temperature.

The present method thus includes supplying heat energy to the two wafers that have been molecularly bonded which liberates water molecules from the interface to increase the bonding force and quality by bringing the wafers closer together at the bonding interface. This supply of heat energy is thus termed a pre-anneal. In an implementation when two silicon wafers are brought into contact, at least one of the wafers may be covered in a layer of silica, and the pre-anneal temperature is advantageously in the range of about 200° C. to 400° C., and more particularly is about 350° C. The time period for the pre-anneal process may be in the range from about 10 minutes to about 360 minutes, and more particularly between about 30 minutes to about 120 minutes.

A comparative study of the bonding energy at the interface between two wafers, one of which had already undergone hydrogen atomic species implantation to form a zone of weakness, was conducted. In a first case no pre-anneal had been carried out, and in the second case a pre-anneal had been carried out at about 350° C. for about 30 minutes. An accurate technique for measuring bonding energy was proposed by Maszara in the document entitled "Silicon-on-Insulator by Wafer Bonding" (J Electrochem Soc, vol 138, p 341 (1991)). Referring to FIG. 1, and in accordance with that technique, a blade 50 was inserted into one or more edges of an assembly of wafers 10 and 20 in contact with each other at the bonding interface 15. A mechanical force was applied to the blade 50 in a direction substantially parallel to the plane of the interface 15 to causes local detachment of the two wafers 10 and 20 and propagation of the detached zone over a certain distance in front of the blade. The length L covered by the bonding wave between the locally detached zone closest to the blade and the point where the two wafers are still bonded provides information regarding the bonding energy existing between the two wafers 10 and 20. The stop point corresponds to a balance between the bonding energy and the elastic deformation characterizing detachment. A mean bonding energy τ is calculated from a relationship between the length of the detached zone L and the surface energy. Reference can, for example, be made to the following formula taken from Maszara's document:

$$\tau = \frac{3 \cdot E \cdot t^3 \cdot y^2}{32 \cdot L^4}$$

In this formula, E is the Young's modulus of the material present at the interface between the two wafers 10 and 20, y is the half-thickness of the blade and t is the thickness of each wafer.

Figure 2:
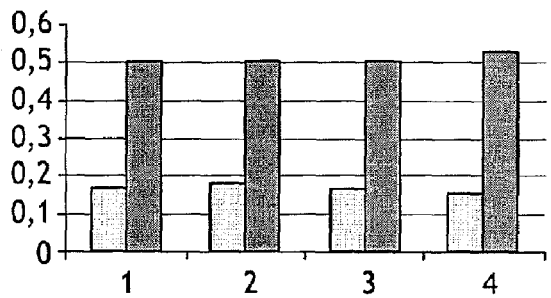
FIG. 2 is a graph comparing the mean bonding energies measured for two wafers that have undergone a treatment with no pre-anneal and a treatment with a pre-anneal.

FIG. 2 shows four comparative studies, wherein each of these comparative studies includes two bonding energy measurements. The two measurements were conducted on substantially identical wafers 10 and 20 which had undergone substantially identical prior surface treatments, and which had been brought into contact under similar conditions. It is important at this juncture to mention that each measurement in each comparative study was carried out in a manner substantially identical to the other measurements, and in particular that applications of the blade to the interface between the wafers 10 and 20 were carried out by exerting substantially identical forces in a substantially identical direction and with a substantially identical blade. Regarding the reliability of these measurements, it was also important to ensure that the bonding quality was essentially due to the bonding energy between the two wafers and was not detrimentally affected by the presence of residual particles between the wafers. For this reason, prior to the bonding energy measurements, the surfaces of the wafers to be bonded were cleaned.

The graph in FIG. 2 shows the bonding energy in joules per square meter ($J/m^2$) on the ordinate. The white columns, which are shorter, show the measurement results from wafers 10 and 20 in contact with each other which had not undergone a pre-anneal process. The solid or black columns are the measurements that were carried out on bonded wafers 10 and 20 which had undergone a pre-anneal process. These measurements were carried out on silicon wafers, one of which had been covered with $SiO_2$, the $SiO_2$ layer thus representing the material present at the interface of the two wafers 10 and 20. The results of the four comparative studies show that the bonding energy in the case of wafers that had undergone the pre-anneal step was two to three times higher than that for wafers 10 and 20 that had not been pre-annealed. It was thus demonstrated that a pre-anneal at about 350° C. for about 30 minutes on oxidized silicon wafers substantially increases the bonding forces between the wafers.

After conducting a pre-anneal step, a further heat treatment was carried out at a temperature substantially higher than the first, pre-anneal temperature in order to detach the useful layer or the thin layer from the donor wafer at the zone of weakness existing in the donor wafer. The further heat treatment may also possibly further reinforce the bonding connections between the useful layer and the receptor wafer, especially by increasing the formation of Si—O—Si bonds. When bonding two wafers of silicon covered with silica, an annealing temperature of up to about 500° C. was advantageously used.

In accordance with the above description, pre-annealing liberated water molecules while reinforcing the bonding interface, but without causing detachment of the useful layer, which resulted in reducing roughness when the useful layer was subsequently detached. The pre-anneal step also prevented the occurrence of many actual and/or potential defects at the interface between the two wafers, as defects would have been far more numerous if the detachment heat treatment had been carried out directly. The improvement in the bonding quality of the two wafers is clearly described below concerning a preferred method which is used to removes a useful or a thin layer from a donor wafer 10 to transfer it to a receptor wafer 20, in particular by carrying out a method of bonding the two wafers 10 and 20 as described above.

Figures 4A, 4B:
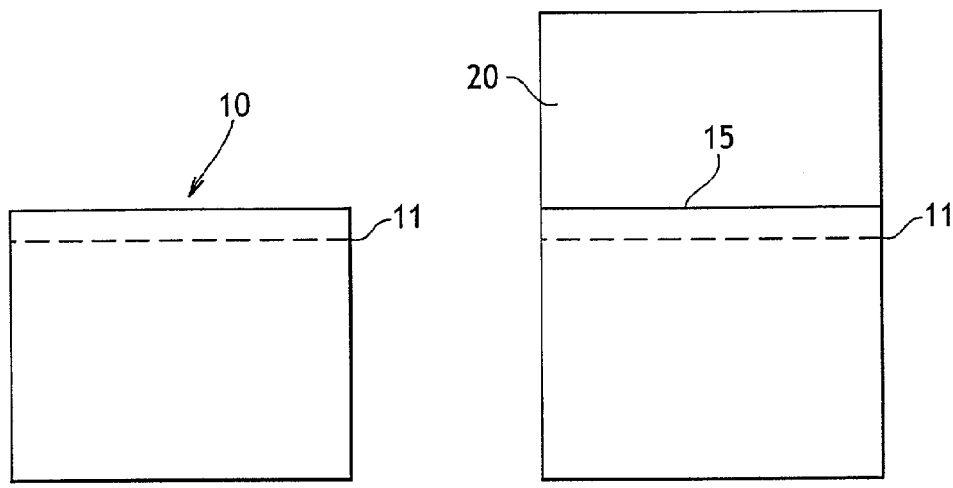
FIGS. 4a to 4c illustrate a method of transferring a useful layer from a first wafer to a second waver according to an embodiment of the invention.

FIG. 4a illustrates a donor wafer 10 including at least an upper portion that includes semiconductor material. The material may be silicon or any other semiconductor alloy or material. In a particular configuration, the bonding surface of the donor wafer 10 is covered with an insulating layer. The insulator can be, in particular, $SiO_2$ that is formed, for example, by thermal oxidation on a donor wafer 10 having silicon at its initial surface.

In a first step of the preferred method, a zone of weakness 11 is formed in the semiconductor material of the donor wafer 10, wherein the weakening corresponds to breaking atomic bonds at the zone of weakness that connects the neighboring portion above the zone of weakness to the neighboring portion below the zone of weakness 11. The zone of weakness 11 may be advantageously formed by atomic species implantation at a predetermined energy and at a predetermined dose, so that it extends substantially parallel to the plane of the surface of the donor wafer 10. The atomic species are preferably hydrogen and/or helium.

Referring now to FIG. 4b, a receptor wafer 20 is brought into contact with the donor wafer 10 at the interface 15. A prior cleaning and/or finishing treatment of the surfaces to be bonded may be advantageously carried out to clean and smooth the surfaces. This cleaning treatment can comprise moistening the surfaces to create a molecular OH—HO bond between the wafers 10 and 20.

Figure 3:
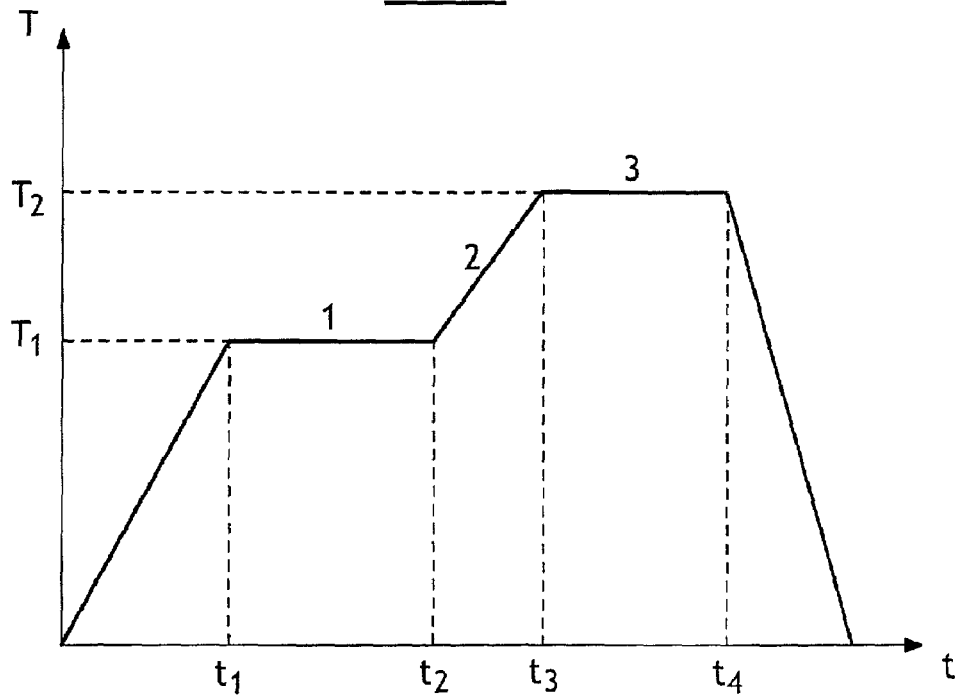
FIG. 3 is a graph of a temperature-time profile of an embodiment of a method according to the invention.

Referring to FIG. 3, the assembly of wafers 10 and 20 then undergoes a pre-anneal 1 as described above at a first temperature $T_1$ and for a first predetermined period of time (between time $t_1$ and time $t_2$). When the donor wafer 10 is formed from oxidized Si, the pre-anneal 1 can be carried out at a temperature $T_1$ in the range of about 200° C. to about 400° C., and more particularly on the order of about 350° C. for a period which can span from several minutes to several hours.

Figure 4C:
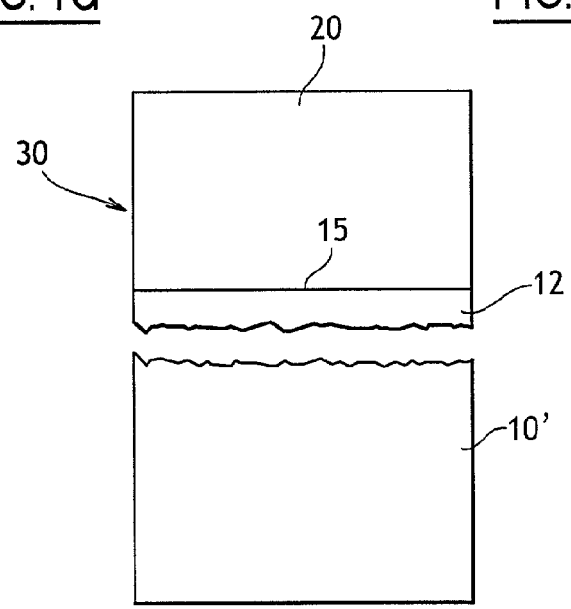

Referring now to FIG. 4c, a third step consists of supplying energy to the assembly of two bonded wafers to detach the portion 12 which is in contact with the receptor wafer 20, from the donor wafer 10 at the zone of weakness 11. The portion 12 corresponds to the thin or useful layer taken from the donor wafer 10 for transfer to the receptor wafer 20, and in which electronic components can advantageously be produced. The supply of energy used to detach the useful layer 12 includes increasing the thermal energy supplied (see step 2 in FIG. 3) between the first temperature $T_1$ and a second temperature $T_2$. The increase in temperature is advantageously substantially continuous, and can be more than about 0.5° C./min, and is typically between about 5° C./min and about 20° C./min for wafers 10 and 20 made of silicon, with at least one of them being covered with an $SiO_2$ layer. Detachment of the useful layer 12 will occur during this progressive temperature increase between a temperature which lies, for example, in the range from about 350° C. to about 500° C.

Referring to FIG. 3, a fourth step consisting of an annealing heat treatment 3 may optionally be conducted to reinforce the bonding interface 15. This anneal 3 can consist of applying a temperature $T_2$ that is higher than the temperature at which detachment has occurred, and maintaining the temperature practically constant for a predetermined period (in the range from a time $t_3$ to a time $t_4$). For example, it is possible to carry out an anneal 3 at a temperature of about 500° C. for about 30 minutes. The anneal 3 allows for the creation of more Si—O—Si bonds (stronger than SiOH—HOSi) bonds). In another implementation, an anneal 3 is not carried out, and the temperature can be dropped directly after the detachment step.

Referring to FIG. 4c, after removing the remaining portion 10' of the donor wafer, an assembly 30 representing the desired structure is obtained. A finishing step is preferably conducted to remove the subsisting roughness on the surface of the useful layer 12 and to make the thickness of the useful layer more uniform. The finishing step can be carried out by polishing, Chemical-Mechanical Polishing (CMP), smoothing, heat treatment, chemical etching, abrasion, or particle bombardment, for example.

When the useful layer is formed from silicon, and when the interface 15 includes an insulating material, then the structure 30 represents an SOI structure. In such circumstances, the remaining donor wafer 10' can be re-used following a recycling step.

Figure 5:
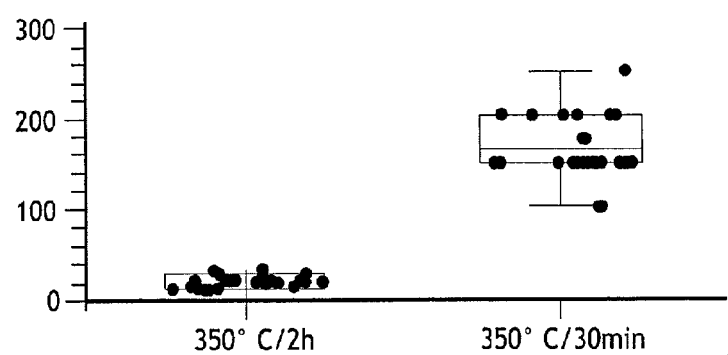
FIG. 5 is a graph of the results of measuring the number of transfer defects in a useful layer transferred from a first wafer to a second wafer that have undergone a pre-anneal process for two hours, and that have undergone a thirty minute pre-anneal process.

FIG. 5 shows a comparative study between the number of transfer defects that occur within the useful layer 12 of the structure 30 as measured after detachment, and after pre-annealing the initial wafers 10 and 20 at about 350° C. for about two hours, and as measured for identical initial wafers 10 and 20 which have undergone a pre-anneal at about 350° C. for about 30 minutes. In each case the wafers 10 and 20 were formed from silicon, with one of them being covered with a layer of $SiO_2$ at the bonding surface.

The ordinate of the graph of FIG. 5 represents the number of transfer defects measured per wafer in the two circumstances in which the anneal consisted of continuously increasing the temperature by about 350° C. over about 2 hours and by about 350° C. over about 30 minutes, the black spots representing the results of the measurements. The results of the measurements can be divided into two sections. The first section, closer to the origin of the graph, includes a set of measurements corresponding to two hour pre-anneals. The second section, further from the origin of the graph, includes a set of measurements corresponding to 30 minute pre-anneals. The mean number of transfer defects for a 2 hour pre-anneal was about 20, while it was on the order of 160 defects for a 30 minute pre-anneal. Thus, a useful layer which has undergone a pre-anneal process for two hours has eight times fewer transfer defects on average than a useful layer that has undergone a 30 minute pre-anneal process. This shows that the pre-anneal duration has a major influence on the quality of bonding, and in particular that a longer duration appears to improve the quality of bonding. It has also been shown that it is important to conduct a pre-anneal to reduce the number of transfer defects that are detrimental to the quality of the useful layer in which future electronic components will be produced. Further, it has been shown that a pre-anneal step improves the bonding quality in the sense that it eliminates defects that occur when detaching the useful layer.

It should be understood that the present invention is not limited to bonding two silicon wafers, nor to bonding two silicon wafers at least one of which is covered with silicon. Thus, the disclosed method is applicable to any type of material such as type IV materials or type IV-IV, type III-VI or type II-VI alloys, which may be binary, ternary or of higher degree.

What is claimed is:

1. A method for minimizing defects caused by the presence of aqueous aggregates at a bonding surface when transferring a useful layer from a donor wafer to a receptor wafer, comprising:

providing a donor wafer having a surface below which a zone of weakness is present to define a useful layer to be transferred;

molecularly bonding at a bonding interface the surface of the useful layer of the donor wafer to a surface of the receptor wafer to form a bonded structure;

heating the bonded structure at a first temperature that is higher than ambient temperature and that is in the range of more than 350° C. to about 400° C. for a first time period of about 10 minutes to about 360 minutes to liberate water molecules from the bonding interface, with the heating being insufficient to cause detachment of the useful layer at the zone of weakness; and detaching the useful layer from the donor wafer by further heating of the bonded structure in a substantially continuous and progressive manner over a time to reach a detachment temperature that is higher than the first temperature where detachment of the useful layer will occur to transfer the useful layer to the receptor wafer.

2. The method of claim 1, wherein the first time period is in the range from about 30 minutes to about 120 minutes.

3. The method of claim 1, which further comprises annealing the structure at a temperature that is higher than the detachment temperature for a second time period to reinforce the bond at the interface.

4. The method of claim 3, wherein the second temperature is no greater than about 500° C.

5. The method of claim 3, wherein the temperature increases continuously over time at a rate of no less than about 0.5° C./minute.

6. The method of claim 1, which further comprises, prior to bonding the useful layer to the receptor wafer, forming the zone of weakness in the donor wafer by atomic species implantation.

7. The method of claim 1, which further comprises, prior to bonding the useful layer to the receptor wafer, forming the zone of weakness in the donor wafer by providing a porous layer in the donor wafer.

8. The method of claim 1, which further comprises, prior to bonding the useful layer to the receptor wafer, forming a layer of bonding material on at least one of the surfaces of the useful layer or the receptor wafer.

9. The method of claim 8, wherein the bonding material is at least one of an electrical insulator or $SiO_2$.

10. The method of claim 1, which further comprises, prior to bonding the useful layer to the receptor wafer, forming a layer of bonding material on each of the useful layer surface and the receptor wafer surface.

11. The method of claim 10, wherein the bonding material is at least one of an electrical insulator or $SiO_2$.

12. The method of claim 1, which further comprises, prior to bonding the useful layer to the receptor wafer, cleaning at least one of the useful layer surface of the donor wafer or the receptor wafer surface.

13. The method of claim 12, wherein the cleaning comprises at least one of chemical treatment, rinsing, or scrubbing.

14. The method of claim 1, which further comprises recycling a remainder portion of the donor wafer after detaching the useful layer.

15. The method of claim 1, wherein the transferring of the useful layer from the donor wafer to the receptor wafer forms an SOI structure.

16. The method of claim 1, which is conducted to achieve a bonding energy of about 0.5 $J/m^2$ between the transfer and the receptor wafer that is increased by at least 2-½ times compared to bonded structures that are not heated to liberate water molecules as recited.

17. The method of claim 1, which is conducted at a temperature which causes all water aggregates to disappear from the bonding interface while not reaching a temperature that will increase roughness of the detached surface of the useful layer.

* * * * *